(12) United States Patent
Kuo et al.

(10) Patent No.: US 11,569,116 B2
(45) Date of Patent: Jan. 31, 2023

(54) LIGHT EMITTING DIODE

(71) Applicant: Lextar Electronics Corporation, Hsinchu (TW)

(72) Inventors: Shiou-Yi Kuo, Hsinchu (TW); Guo-Yi Shiu, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 1 day.

(21) Appl. No.: 17/344,924

(22) Filed: Jun. 10, 2021

(65) Prior Publication Data

US 2021/0398841 A1 Dec. 23, 2021

(30) Foreign Application Priority Data

Jun. 23, 2020 (TW) ................. 109121380

(51) Int. Cl.
| | | |
|---|---|---|
| *H01L 21/683* | (2006.01) | |
| *H01L 25/075* | (2006.01) | |
| *H01L 33/22* | (2010.01) | |
| *H01L 33/62* | (2010.01) | |

(52) U.S. Cl.
CPC ...... *H01L 21/6835* (2013.01); *H01L 25/0753* (2013.01); *H01L 33/22* (2013.01); *H01L 33/62* (2013.01); *H01L 2221/68354* (2013.01); *H01L 2221/68368* (2013.01); *H01L 2221/68381* (2013.01); *H01L 2933/0066* (2013.01)

(58) Field of Classification Search
CPC . H01L 21/6835; H01L 25/0753; H01L 33/22; H01L 33/62; H01L 2221/68354; H01L 2221/68368; H01L 2221/68381; H01L 2933/0066; H01L 2221/6835; H01L 33/44; H01L 33/0093; H01L 33/58; H01L 33/0095
USPC .......................................................... 257/98
See application file for complete search history.

(56) References Cited

U.S. PATENT DOCUMENTS

| | | |
|---|---|---|
| 5,286,335 A | 2/1994 | Drabik et al. |
| 5,779,924 A | 7/1998 | Krames et al. |
| 7,018,859 B2 | 3/2006 | Liao et al. |
| 9,508,894 B2 | 11/2016 | Lu et al. |
| 9,577,164 B2 * | 2/2017 | Tsujimoto ............... H01L 33/44 |
| 9,941,262 B2 | 4/2018 | Thompson |
| 10,193,038 B2 | 1/2019 | Farrens et al. |
| 10,304,810 B2 | 5/2019 | Gardner et al. |
| 10,361,341 B2 | 7/2019 | Danesh et al. |
| 2005/0098878 A1 | 5/2005 | Yu et al. |

(Continued)

FOREIGN PATENT DOCUMENTS

| | | |
|---|---|---|
| CN | 1773736 A | 5/2006 |
| CN | 101009344 A | 8/2007 |

(Continued)

*Primary Examiner* — Vu A Vu
(74) *Attorney, Agent, or Firm* — CKC & Partners Co., LLC

(57) ABSTRACT

A light emitting diode includes an active layer, a first type semiconductor layer, a second type semiconductor layer and a pick-up layer. The first type semiconductor layer and the second type semiconductor layer are located on two opposite sides of the active layer respectively. The pick-up layer is located on the second type semiconductor layer, wherein the pick-up layer has a patterned outer surface to serve as a grabbed surface during transferring.

8 Claims, 6 Drawing Sheets

(56) References Cited

U.S. PATENT DOCUMENTS

| | | | |
|---|---|---|---|
| 2006/0204865 A1* | 9/2006 | Erchak | H01L 33/22 |
| | | | 430/7 |
| 2013/0140592 A1 | 6/2013 | Lee et al. | |
| 2018/0097147 A1 | 4/2018 | Ichikawa | |
| 2018/0331253 A1* | 11/2018 | Gran | H01L 21/7806 |
| 2019/0393069 A1 | 12/2019 | Paranjpe et al. | |

FOREIGN PATENT DOCUMENTS

| | | |
|---|---|---|
| CN | 102044608 A | 5/2011 |
| JP | 2006-128227 A | 5/2006 |
| JP | 2008-205468 A | 9/2008 |
| JP | 2011-233650 A | 11/2011 |
| JP | 2013-201411 A | 10/2013 |
| JP | 2015-056652 A | 3/2015 |
| JP | 2015-088524 A | 5/2015 |
| JP | 2015-111639 A | 6/2015 |
| JP | 2017-050472 A | 3/2017 |
| JP | 2019-534565 A | 11/2019 |
| TW | 201025558 A1 | 7/2010 |
| TW | 201128806 A1 | 8/2011 |
| TW | 201231304 A1 | 8/2012 |
| TW | 201724557 A | 7/2017 |
| WO | 2016/110896 A1 | 7/2016 |

* cited by examiner

LIGHT EMITTING DIODE

CROSS-REFERENCE TO RELATED APPLICATION

This application claims priority to Taiwan Application Serial Number 109121380, filed Jun. 23, 2020, which is herein incorporated by reference in its entirety.

BACKGROUND

Field of Invention

The present disclosure relates to a light emitting diode.

Description of Related Art

Micro LED is a new generation display technology. The micro LED includes advantages of low power consumption, high brightness, high resolution, and high color saturation. Therefore, display panels composed of micro LEDs are regarded as the mainstream of the next generation display technologies.

Since the volume of the micro LED is on the order of micrometers, a mass transfer step is an inevitable and important manufacturing process. There are currently many mass transfer methods, among which laser transfer is the method that currently has the opportunity to achieve the highest transfer efficiency at the lowest cost, but its transfer yield may vary depending on the shape of the micro LED and thus cannot become a stable process. Therefore, there is a need for a novel micro LED and its manufacturing process, which can use the laser transfer method to achieve a huge amount of transferring and a high transfer yield.

SUMMARY

One aspect of the present disclosure is to provide a light emitting diode, which includes an active layer, a first type semiconductor layer, a second type semiconductor layer and a pick-up layer. The first type semiconductor layer and the second type semiconductor layer are located on two opposite sides of the active layer respectively. The pick-up layer is located on the second type semiconductor layer, wherein the pick-up layer has a patterned outer surface to serve as a grabbed surface during transferring.

In one or more embodiments, the pick-up layer is configured to be transmitted by light beams emitted by the active layer.

In one or more embodiments, the pick-up layer contains materials that are configured to be dissociated by a laser beam.

In one or more embodiments, the pick-up layer contains organic materials.

In one or more embodiments, the organic materials contain benzocyclobutene.

In one or more embodiments, the pick-up layer contains photosensitive polymer material.

In one or more embodiments, the second type semiconductor layer contains a roughened upper surface.

In one or more embodiments, the patterned outer surface is a uniformly patterned surface.

In one or more embodiments, the roughened upper surface is an irregular roughened surface.

In one or more embodiments, the roughened upper surface is in direct contact with the pick-up layer.

In summary, the light-emitting diode disclosed herein selects appropriate materials for the pick-up layer, which not only forms the patterned outer surface as the grabbed surface during transfer but also serves as the sacrificial layer of the laser lift-off process, such that the light-emitting diode structure can achieve higher transfer efficiency with fewer layers and lower costs. Since the grabbed surface contains appropriate uniform patterns, the bonding force between the grabbed surface and the grab device is strengthened to overcome the bonding force between the light-emitting diode and the temporary substrate, thereby reducing the probability of grasping failure, and improving the grasping stability so as to improve the yield rate of die transfer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
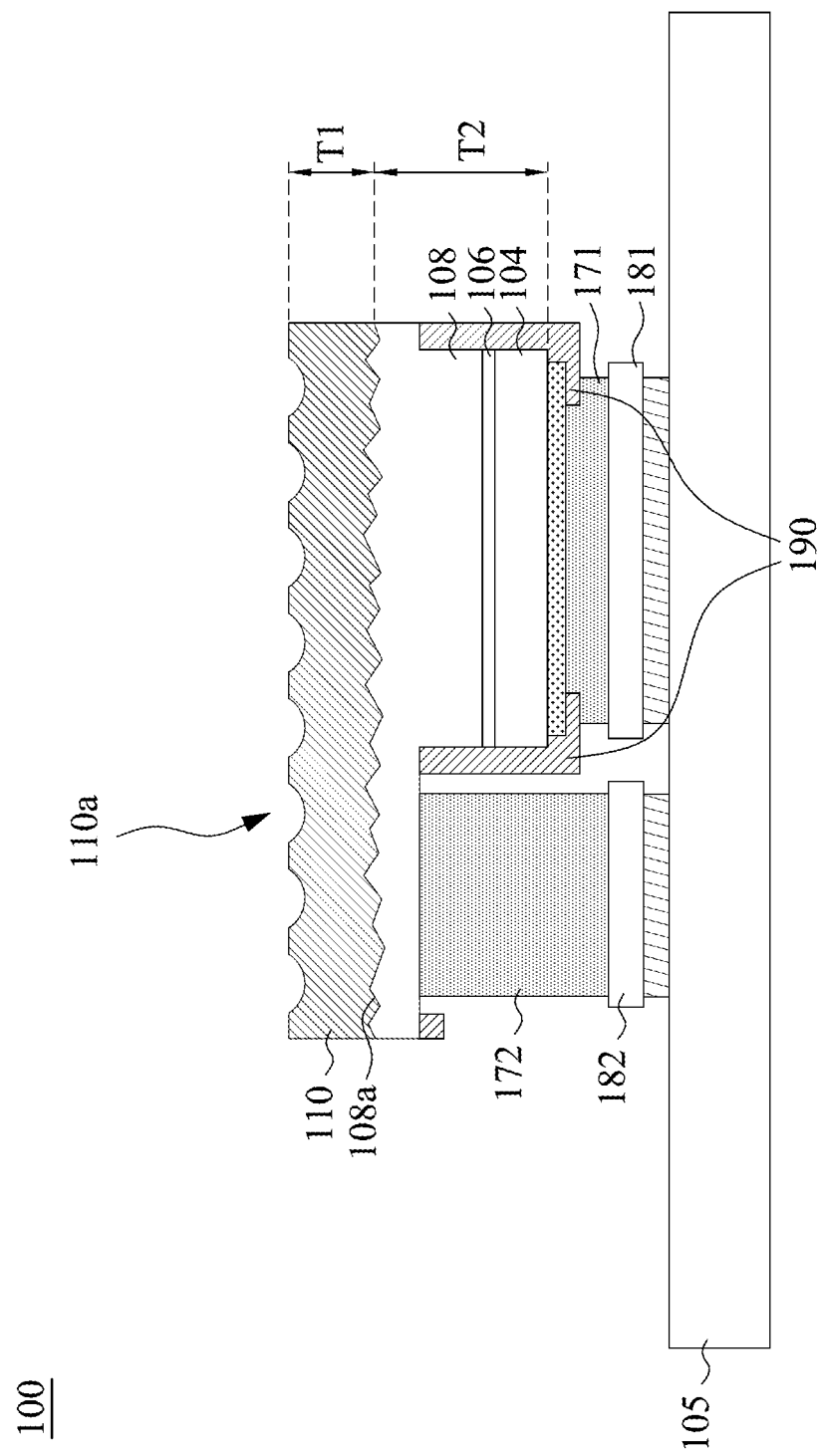
FIG. 1 illustrates a cross sectional view of a light-emitting diode in accordance with an embodiment of the present disclosure.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not necessarily be drawn to scale, and the identical elements of the embodiments are designated with the same reference numerals.

Reference is made to FIG. 1, which illustrates a cross sectional view of a light-emitting diode in accordance with an embodiment of the present disclosure. The light-emitting diode 100 includes a first type semiconductor layer 104, an active layer 106, a second type semiconductor layer 108, and a pick-up layer 110. In some embodiments, the active layer 106 is a multilayer structure with multiple quantum wells (MQW). The quantum well can make electrons and holes having a higher chance of combining so as to generate light, which improves the luminous efficiency of the light-emitting diode 100.

In this embodiment, a total thickness T2 of the first type semiconductor layer 104, the active layer 106, and the second type semiconductor layer 108 is greater than a thickness T1 of the pick-up layer 110, but not being limited thereto.

The first type semiconductor layer 104 and the second type semiconductor layer 108 are respectively arranged on two opposite sides of the active layer 106. For example, the first type semiconductor layer 104 is located on a first surface of the active layer 106, and the second type semiconductor layer 108 is located on a second surface of the active layer 106. The conductivity types of the first type semiconductor layer 104 and the second type semiconductor layer 108 are different. In some embodiments, the first type semiconductor layer 104 is an N-type doping layer, and the second type semiconductor layer 108 is a P-type doping layer. In some embodiments, the materials of the semiconductor layer includes Group III-V semiconductor, for example, a Group III nitride, a Group III phosphide, a Group III arsenide, or a Group III phosphorus arsenide. In this embodiment, the first type semiconductor layer 104 may be N-type doped aluminum indium gallium phosphide (AlInGaP), and the second type semiconductor layer 108 may be P-type doped gallium phosphide (GaP).

The light-emitting diode 100 further includes a first contact pad 171 and a second contact pad 172, which are located on the first type semiconductor layer 104 and the second type semiconductor layer 108, respectively. The first contact pad 171 is electrically connected to a corresponding electrode of the substrate 105 via a first weld metal layer 181. The second contact pad 172 is electrically connected to a corresponding electrode of the substrate 105 via a second weld metal layer 182. The light-emitting diode 100 also includes an insulation layer 190 located on sidewalls of the first and second type semiconductor layers (104, 108) and the active layer 106. The insulation layer 190 not only provides insulation function but also has better mechanical strength to prevent the first type semiconductor layer 104, the active layer 106, and the second type semiconductor layer 108 from being damaged.

In this embodiment, the pick-up layer 110 has a patterned outer surface as the grabbed surface 110a, and the grabbed surface 110a may be a uniformly patterned surface to facilitate a grab device to control its grabbing mechanism, but not being limited.

In this embodiment, the pick-up layer 110 is in direct contact with a light-emitting surface of the second type semiconductor layer 108 and serves as a light-emitting path such that it needs to be transmitted by light beams emitted by the active layer 106.

In this embodiment, the surface of the second type semiconductor layer 108, which is in direct contact with the pick-up layer 110, may be a roughened upper surface 108a, so as to increase a light extraction efficiency. For example, an irregularly roughened surface can be formed on the surface of the second type semiconductor layer 108 by a wet etching process.

Figure 2:
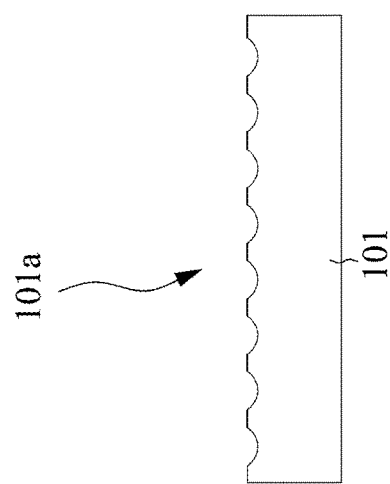

Reference is made to FIGS. 2-8, which illustrate manufacturing steps of cross sectional views of a light-emitting diode in accordance with embodiments of the present disclosure. In the step of FIG. 2, a transparent substrate 101 is provided. The transparent substrate 101 has a uniformly patterned surface 101a, such as a sapphire substrate with a uniformly patterned surface.

Figure 3:
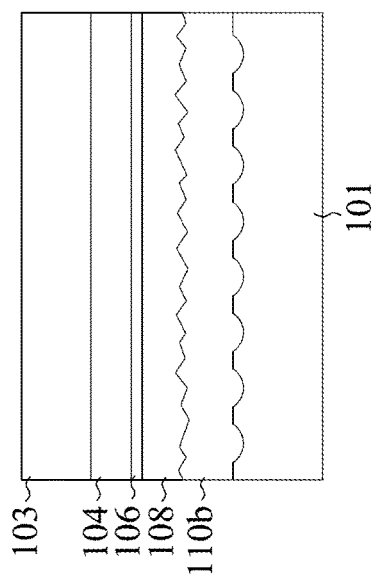

In the step of FIG. 3, an epitaxial deposition body including a native substrate 103 is provided and a light-transmitting adhesive layer 110b is adhered to the transparent substrate 101. The epitaxial deposition body includes a first type semiconductor layer 104, an active layer 106, and a second type semiconductor layer 108 sequentially deposited on the native substrate 103. In this embodiment, the native substrate 103 may be a gallium arsenide (GaAs) substrate. The light-transmitting adhesive layer 110b may include a photosensitive polymer material, which is cured into the pick-up layer 110 after being irradiated, and the uniformly patterned surface 101a of the transparent substrate 101 is transferred to the pick-up layer 110 to form a uniformly patterned outer surface as the grabbed surface 110a.

Figure 4:
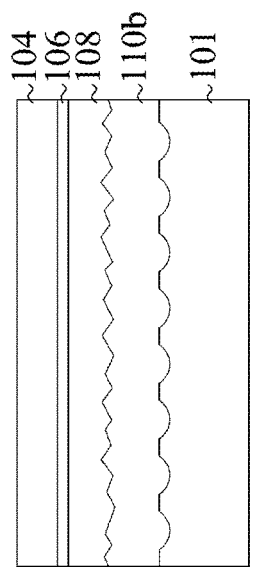
FIGS. 2-8 illustrate manufacturing steps of cross sectional views of a light-emitting diode in accordance with embodiments of the present disclosure.

In the step of FIG. 4, the native substrate 103 is removed from the epitaxial deposition body.

Figure 5:
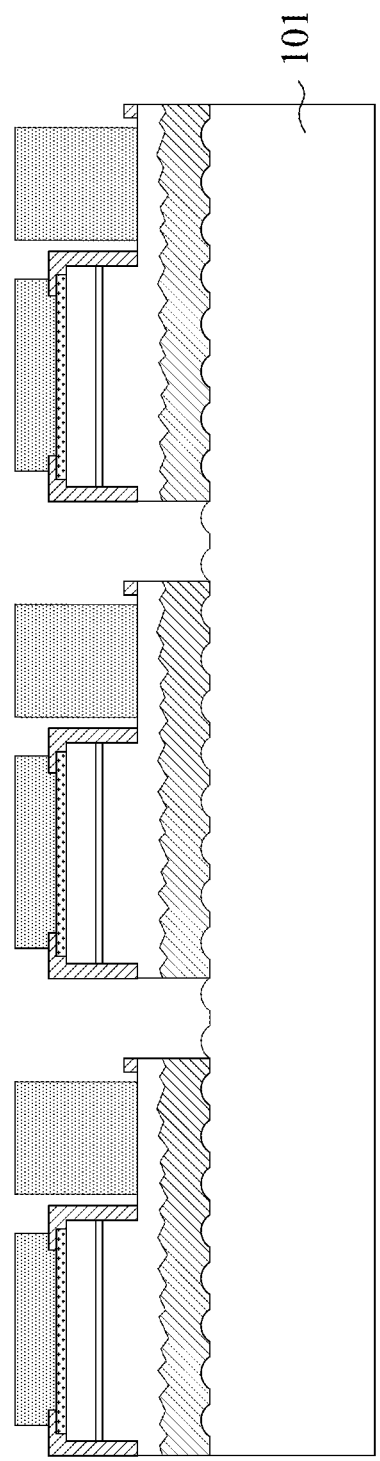

In the step of FIG. 5, the epitaxial deposition body is divided into a plurality of light-emitting diodes, which are adhered on the transparent substrate 101.

Figure 6:
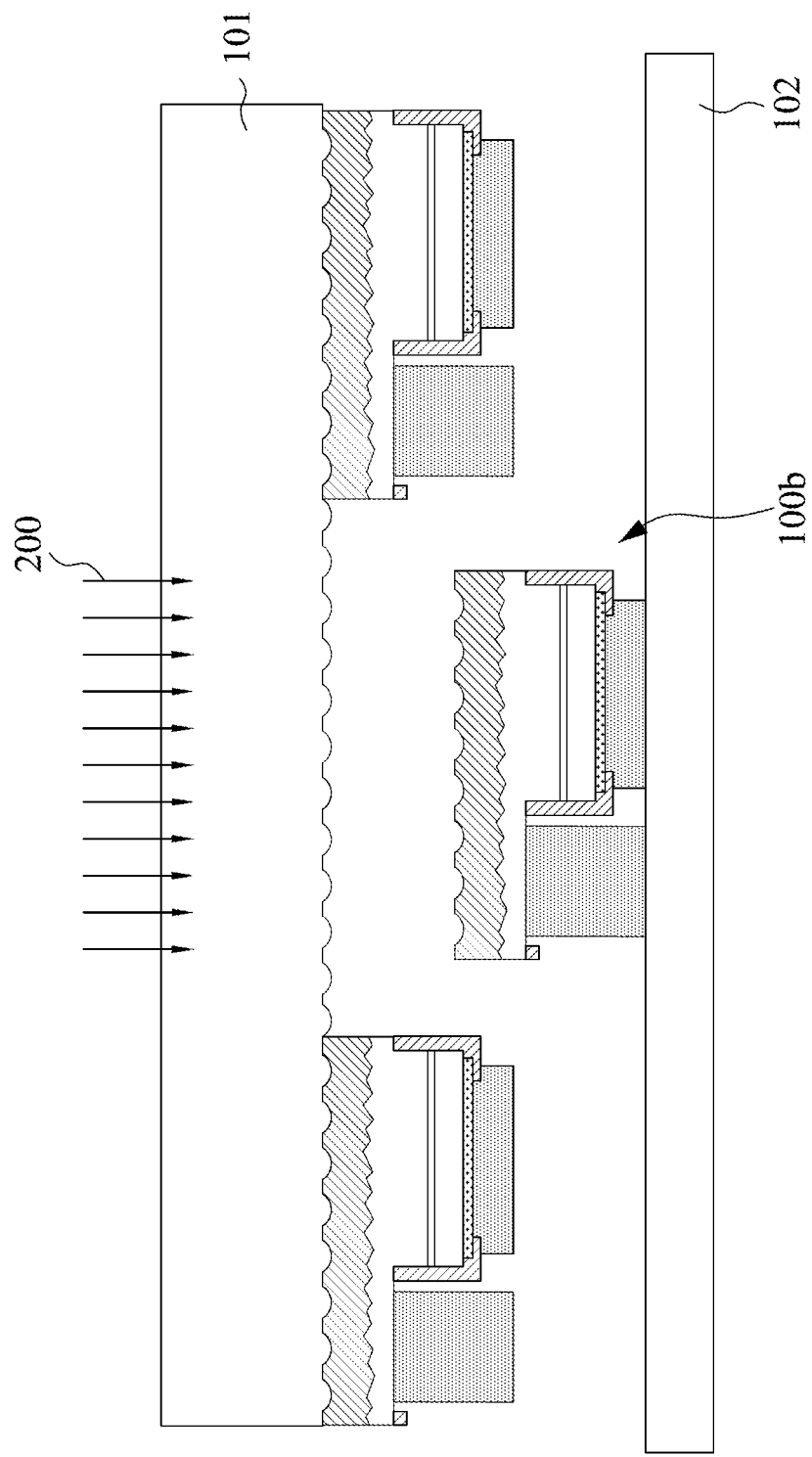

In the step of FIG. 6, the transparent substrate 101 is turned upside down, and the pick-up layer 110 of the light-emitting diode 100b to be transferred is irradiated with the laser light 200 such that the pick-up layer 110 in contact with the transparent substrate 101 is dissociated and destroyed (i.e., laser lift-off process), and thus is separated from the transparent substrate 101 and located on a temporary substrate 102. A similar laser lift-off process may need to be performed several times to transfer light-emitting diodes of desired colors (e.g., red, green, and blue LEDs) from different substrates to the temporary substrate 102. The pick-up layer 110 must contain materials that can be dissociated by lasers before the laser lift off (LLO) process is utilized. The material of the pick-up layer 110 may include organic materials, such as benzocyclobutene and other materials that can be dissociated by a laser beam.

Figure 7:
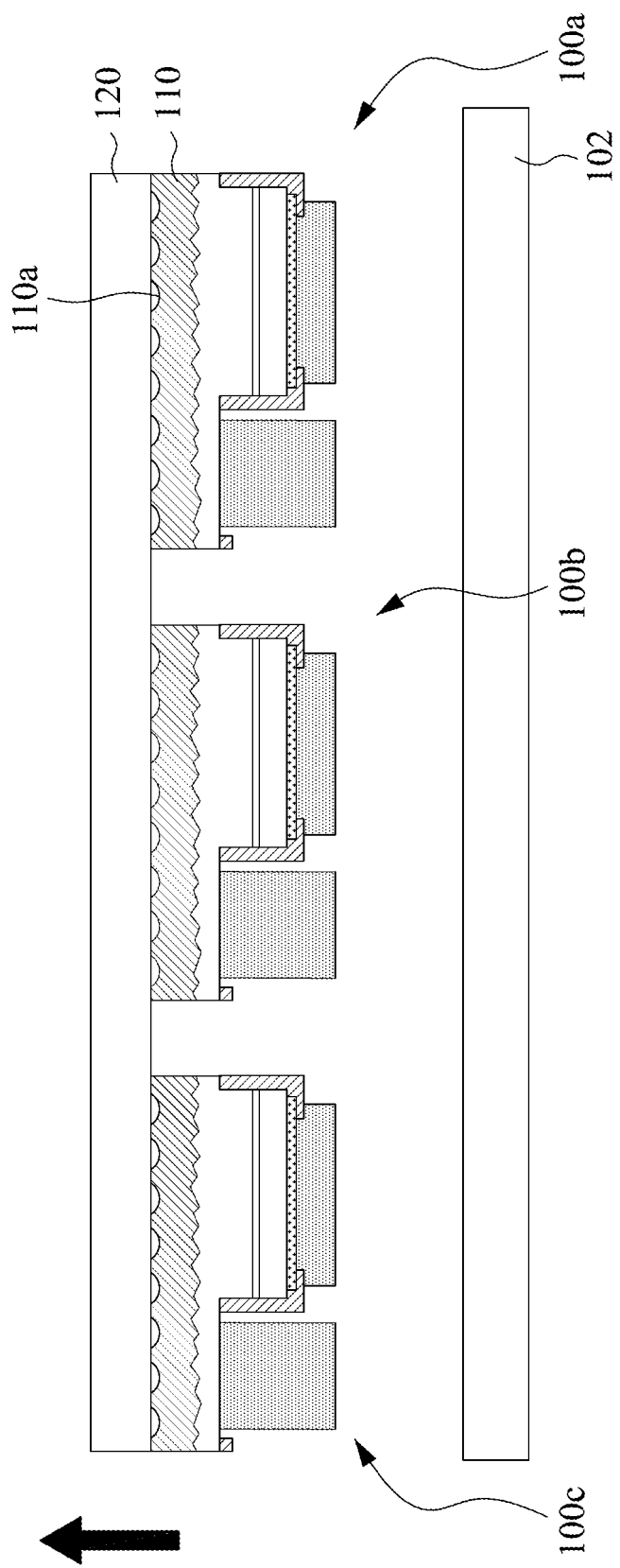

In the step of FIG. 7, a grab device 120 is used to grab light-emitting diodes (100a-c) of desired colors (e.g., red, green, and blue LEDs) from the temporary substrate 102. Because the grabbed surface 110a is a patterned surface, a contact area between the grabbed surface 110a and the grab device 120 is increased. Compared with the unpatterned flat grabbed surface, it can improve the stability during grabbing, reduce the probability of grabbing failure, and increase die transfer yield. The factors that affect the grasping yield include the size of an LED die (e.g., the grabbed surface area), the grasping force of the grab device 120 on the die (such as viscosity, suction, etc.), and the bonding force between the die and the temporary substrate (e.g., the substrate viscosity, the hardness of the support frame, etc.), and the shape, density, size, depth, and other conditions of the grabbed surface pattern can be adjusted according to different conditions. For example, small or shallow patterns are required for small dies, and larger or deeper patterns are required for large dies. Or when the grab device 120 has a relatively small gripping force (for example, low viscosity), the temporary substrate is relatively sticky, or the support frame is relatively hard, the grabbed surface 110a may need dense and deep patterns. As long as considering the above parameters before the die is placed on the substrate (before the transfer pattern is formed), the best grabbed surface pattern can be designed.

Figure 8:
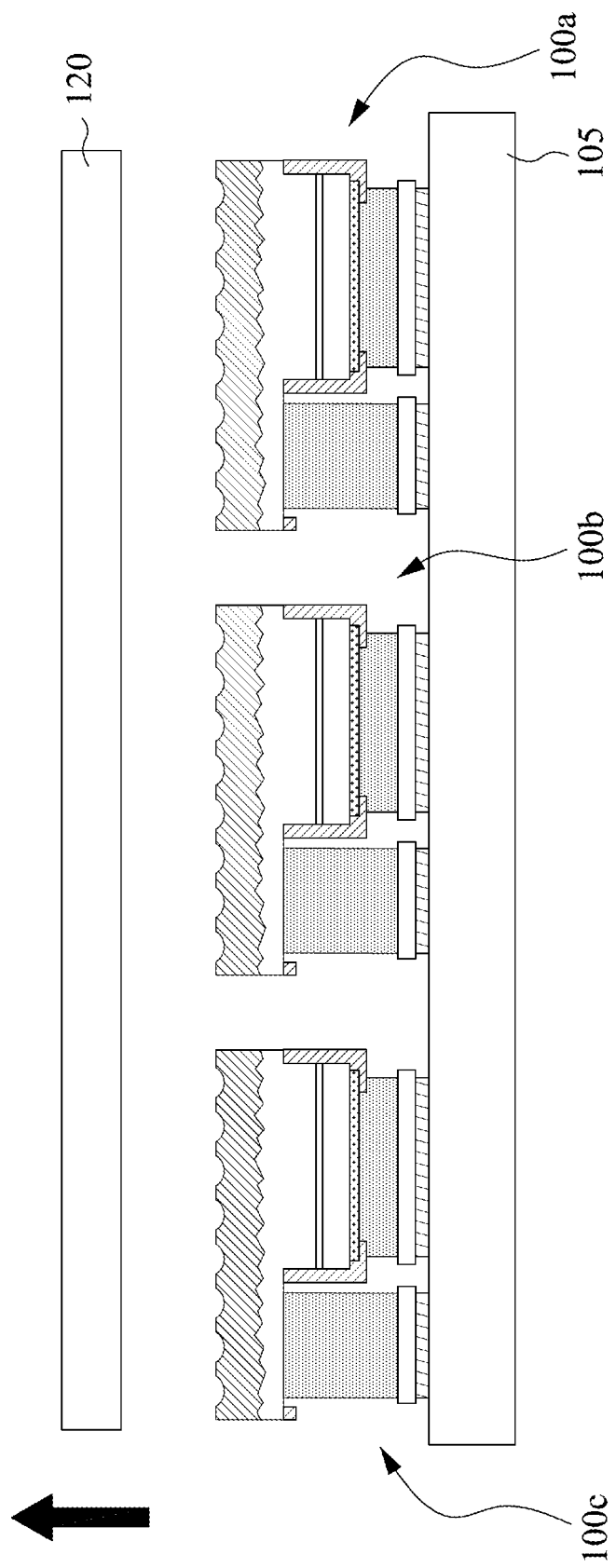

In the step of FIG. 8, the grab device 120 is used to transfer the grabbed light-emitting diodes (100a-c) onto a final substrate 105, and the light-emitting diodes (100a-c) electrically connect to the final substrate 105.

In summary, the light-emitting diode disclosed herein selects appropriate materials for the pick-up layer, which not only forms the patterned outer surface as the grabbed surface during transfer but also serves as the sacrificial layer of the laser lift-off process, such that the light-emitting diode structure can achieve higher transfer efficiency with fewer layers and lower costs. Since the grabbed surface contains appropriate uniform patterns, the bonding force between the grabbed surface and the grab device is strengthened to overcome the bonding force between the light-emitting diode and the temporary substrate, thereby reducing the probability of grasping failure, and improving the grasping stability so as to improve the yield rate of die transfer.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode comprising:
    an active layer;
    a first type semiconductor layer and a second type semiconductor layer disposed on two opposite sides of the active layer respectively, wherein the second type semiconductor layer has a roughened upper surface;
    a first contact pad located on the first type semiconductor layer;
    a second contact pad located on the second type semiconductor layer; and
    a pick-up layer in direct contact with the roughened upper surface of the second type semiconductor layer, and has a patterned outer surface to serve as a grabbed surface during transferring,
    wherein both the first and second contact pads are disposed on one side of the second type semiconductor layer, and the pick-up layer is disposed on another side of the second type semiconductor layer that is opposite to the side on which the first and second contact pads are disposed.

2. The light emitting diode of claim 1, wherein the pick-up layer is configured to be transmitted by light beams emitted by the active layer.

3. The light emitting diode of claim 1, wherein the pick-up layer comprises materials that are configured to be dissociated by a laser beam.

4. The light emitting diode of claim 1, wherein the pick-up layer comprises organic materials.

5. The light emitting diode of claim 4, wherein the organic materials comprise benzocyclobutene.

6. The light emitting diode of claim 1, wherein the pick-up layer comprises photosensitive polymer material.

7. The light emitting diode of claim 1, wherein the patterned outer surface is a uniformly patterned surface.

8. The light emitting diode of claim 1, wherein the roughened upper surface is an irregularly roughened surface.

* * * * *